United States Patent
Nishikawa et al.

(10) Patent No.: US 6,417,111 B2
(45) Date of Patent: *Jul. 9, 2002

(54) PLASMA PROCESSING APPARATUS

(75) Inventors: Kazuyasu Nishikawa; Hiroki Ootera; Tatsuo Oomori, all of Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/496,466

(22) Filed: Feb. 2, 2000

(30) Foreign Application Priority Data

Jul. 5, 1999 (JP) .......................... 11-190103

(51) Int. Cl.[7] .......................... H01L 21/00; H05H 1/00; C23C 16/00
(52) U.S. Cl. ...................... 438/710; 438/711; 427/569; 427/585; 156/345.34; 156/345.48; 156/345.47; 156/345.43; 118/723 E; 118/723 I
(58) Field of Search ....................... 156/345.47, 345.34, 156/345.48, 345.43; 118/723 I, 723 E, 723 MW, 719, 723 FE, 723 FI; 438/710, 711, 689, 700, 706, 712, 713, 714, 724; 427/569, 585; 216/67

(56) References Cited

U.S. PATENT DOCUMENTS

| 5,108,535 | A | | 4/1992 | Ono et al. | |
|---|---|---|---|---|---|
| 5,156,703 | A | * | 10/1992 | Oechsner | 156/643 |
| 5,552,017 | A | | 9/1996 | Jang et al. | |
| 5,614,025 | A | * | 3/1997 | Akimoto | 118/723 MP |
| 5,647,944 | A | * | 7/1997 | Tsubaki et al. | 156/345 |
| 5,733,405 | A | | 3/1998 | Taki et al. | |
| 5,795,429 | A | * | 8/1998 | Ishii et al. | 156/345 |
| 5,958,140 | A | * | 9/1999 | Arami et al. | 118/725 |
| 6,013,155 | A | * | 1/2000 | McMillin et al. | 156/345 |
| 6,071,572 | A | * | 6/2000 | Mosley et al. | 427/570 |
| 6,076,483 | A | * | 6/2000 | Sintani et al. | 118/723 MA |
| 6,125,788 | A | * | 10/2000 | Hills et al. | 118/723 E |
| 6,132,550 | A | * | 10/2000 | Shiomi | 156/345 |
| 6,132,552 | A | * | 10/2000 | Donohoe et al. | 156/345 |
| 6,248,206 | B1 | * | 6/2001 | Herchen et al. | 156/345 |

FOREIGN PATENT DOCUMENTS

| JP | 6-163465 | | 6/1994 | |
|---|---|---|---|---|
| JP | 6-224136 | | 8/1994 | |
| WO | WO 96/17973 | * | 6/1996 | C23C/16/44 |

OTHER PUBLICATIONS

Tachi et al.; "Low–temperature reactive ion etching and microwave plasma etching of silicon", *Appl. Phys. Lett.*, vol. 52, No. 8, pp. 616–618, Feb. 22, 1988.

Samukawa et al.; "Dependence of ECR Plasma Etching Characteristics on Sub Magnetic Field and Substrate Position", *Japanese J. of Applied Physics*, vol. 29, No. 4, pp. 792–797, Apr. 1990.

Tsujimoto et al.; "A New Side Wall Protection Technique in Microwave Plasma Etching Using a Chopping Method", Extended Abstracts of the 18th (1986 Intl.) Conference on Solid State Devices and Materials, Tokyo, 1986, pp. 229–232.

\* cited by examiner

*Primary Examiner*—Gregory Mills
*Assistant Examiner*—P. Hassanzadeh
(74) *Attorney, Agent, or Firm*—Leydig, Voit & Mayer, Ltd.

(57) ABSTRACT

A plasma processing method includes introducing at least one first processing gas into a processing chamber including a mounting stage supporting a substrate having a surface; generating a plasma in the first processing gas; introducing a second processing gas into a gas storage chamber separated from the processing chamber by a partition opposite the mounting stage and including a plurality of jet holes; and jetting neutral particles of the second processing gas from the gas storage chamber toward the substrate through the jet holes in a direction generally perpendicular to the surface of the substrate, thereby plasma processing the substrate.

9 Claims, 9 Drawing Sheets

| 1 : processing container | 7 : partition plate |
|---|---|
| 2 : processing chamber | 8 : jet ports |
| 3 : insulating plate | 9 : radio frequency antenna |
| 4 : mounting stage | 10a,10b : matching unit |
| 5 : workpiece | 11a,11b : radio frequency power supply |
| 6 : gas storage chamber | 12a,12b : gas line |

Fig.1

1 : processing container
2 : processing chamber
3 : insulating plate
4 : mounting stage
5 : workpiece
6 : gas storage chamber
7 : partition plate
8 : jet ports
9 : radio frequency antenna
10a,10b : matching unit
11a,11b : radio frequency power supply
12a,12b : gas line

13 : dielectric window

Fig.5

14 : wave guide

Fig.6

10c : matching unit
11c : high frequency power supply

Fig.7

15 : grounding plate

Fig.8

16 :electrode

Fig.9

17 : ion source
18 : ion accelerator

PLASMA PROCESSING APPARATUS

BACKGROUND OF THE INVENTION

1. Field of the Invention

The present invention relates to a semiconductor manufacturing apparatus to be used for forming a thin film on a surface of a workpiece or for etching a surface of a workpiece, and more particularly to a plasma processing apparatus for processing a surface of a workpiece having a deep groove or hole which is very small in dimension and high in an aspect ratio.

2. Description of the Related Art

Conventionally, a plasma processing apparatus utilizing a plasma has often been used as a processing apparatus for forming a thin film onto a fine pattern formed over a surface of an object to be processed such as a workpiece, for example, a substrate or a semiconductor wafer (hereinafter referred to as a "wafer") or for performing fine processing of a surface of a workpiece. One or more processing gases are introduced into a processing chamber of the plasma processing apparatus, thereby generating a plasma. Consequently, some ions (reactive ions) and neutral particles (neutral radicals) contributing to the reaction are generated in the plasma. The ions are accelerated by the sheath on the surface of the workpiece and reach the surface of the workpiece, thereby contributing to the processing of the surface of the workpiece. The neutral radicals are transported to the surface of the workpiece by diffusion and deposit on the surface of the workpiece which contributes to the surface processing of the workpiece by performing a surface reaction or a reaction by the aid of the energy of ions incident on the surface.

For a method for forming a thin film on a surface of a deep groove or hole which is very small in dimension and high in an aspect ratio, molecular structures of a raw material for CVD (chemical vapor deposition) gas have been conventionally devised. Consequently, step coverage on a pattern surface has been improved and the formation of a thin film on a pattern having a high aspect ratio has been implemented.

On the other hand, as a method for performing fine processing of, for example, a deep groove or hole which is very small in dimension and high in an aspect ratio, there is a method for increasing the energy of ions incident on the surface of a workpiece. By this method, workability in the direction perpendicular to the surface of the workpiece has been improved and a pattern having a high aspect ratio has been formed.

However, as an aspect ratio of a pattern more increases, it becomes more difficult to process the surface thereof according to the conventional method.

In order to solve the above mentioned problem, several methods were proposed, which prevent the reaction by ions incident on a side wall of a pattern in plasma etching. For example, a method for forming an inhibitor layer on the side wall of the pattern, which layer protects the surface from the reactive species, is described in "Extended Abstracts of Solid State Devices and Materials, p 229 (1986)"; a method for reducing the temperature of a workpiece is described in "Appl. Phys. Lett., 52, 616 (1988)"; and a method for decreasing a gas pressure is described in "Jpn. J. Appl. Phys., 29, 792 (1990)".

However, even if these methods are used, an incident flux of the neutral radicals into a pattern having a high aspect ratio decreases during etching of the pattern having a high aspect ratio. In some cases, therefore, the inhibitor layer formed on the side wall of the pattern became thin, so that etching by ions incident on the side wall of the pattern could not be prevented.

Moreover, Japanese Patent Kokai Publication No. 163465/1994 has proposed a method for supplying a sufficient amount of neutral radicals to a pattern bottom by separating a processing chamber from a plasma chamber, and keeping the gas pressure within the plasma chamber higher than that of the processing chamber to provide the neutral radicals and gas molecules with a kinetic energy in the direction to the substrate and to enhance the incident directivity of the neutral radicals being supplied.

According to the above mentioned method, a unit construction is proposed to produce the pressure difference between the plasma generating chamber and the processing chamber, wherein a porous plate having holes of small diameters (which are not more than 3 mm) is provided and a plurality of turbo molecule pumps are provided so that gas within the processing chamber is exhausted at a total exhausting rate of 4000 litters/sec. However, in addition to an increase in the size of the apparatus, it is difficult for ions to transport to the processing chamber due to the small diameters of the holes, and ions are confined within the plasma generating chamber. Therefore, a plasma density within the processing chamber or an incident ion flux onto the workpiece becomes insufficient for processing the workpiece. In the case where an oxide film etching of a pattern having a high aspect ratio is carried out, there was a problem that an etch rate rapidly decreases due to the insufficient incident ion flux, so that through-put is reduced. In other words, although the neutral radicals are easily incident on the bottom portion of the pattern having a high aspect ratio by the porous plate provided to enhance the incidence directivity of the neutral radicals, the ion flux transported to the processing chamber decreases. As a result of the decrease of the ion flux, ions contributing to the etching reaction become poor so that the etch rate is depressed. The above mentioned method may be considered to be effective in etching reaction of silicon or organic materials in which neutral radicals mainly contribute to the reaction, however it is not suitable for etching of oxide film in which ions mainly contribute to the reaction. Further, the neutral radicals pass through the porous plate more easily than the ions since the formers are not affected by the sheath, however, they have a limited lifetime since they easily recombine with other molecules to be changed into other kinds of molecules or readily deposit on the wall of an apparatus. According to the above mentioned method, even if the neutral particles easily reach the bottom portion of the pattern having a high aspect ratio, most of the neutral radicals deposit on the surface of the plasma generating chamber or the number thereof decreases within the plasma generating chamber, so that the flux of the neutral radical incident on the workpiece is not so large. Therefore, it was difficult to enhance an etch rate even in which the neutral radicals mainly contribute to the reaction.

SUMMARY OF THE INVENTION

In order to solve the above mentioned problems of the prior art, it is an object of the present invention to provide a plasma processing apparatus capable of forming a thin film over a groove or hole which is very small in dimension and high in an aspect ratio at a high rate or forming a pattern with high precision at a high etch rate.

A first aspect of the present invention is directed to a plasma processing apparatus which comprises a processing chamber, processing gas supply means for supplying one or more processing gases into the processing chamber, plasma generating means for changing the processing gases supplied into the processing chamber to a plasma, a mounting stage for mounting an object to be processed which is provided in the processing chamber, bias applying means for applying an electrical bias voltage to the mounting stage, a gas storage chamber which is placed at a position opposite to a face of the mounting stage (on which the object being processed is mounting) and which is provided with a supply system for supplying neutral particles or one or more gases to generate the neutral particles, a partition plate which separates the gas storage chamber from the processing chamber and having jet holes for jetting the neutral particles into the processing chamber, and an exhaust system.

A second aspect of the present invention is directed to the plasma processing apparatus according to the first aspect of the present invention, wherein the partition plate is a counter electrode which is placed in a position opposite to a face of the mounting stage.

A third aspect of the present invention is directed to the plasma processing apparatus according to the second aspect of the present invention, wherein the partition plate comprises a dielectric film formed on an electric conductor.

A fourth aspect of the present invention is directed to the plasma processing apparatus according to the second aspect of the present invention wherein the partition plate is grounded.

A fifth aspect of the present invention is directed to the plasma processing apparatus according to the second aspect of the present invention wherein the partition plate is provided with a power supply for applying a radio frequency or a DC bias voltage.

A sixth aspect of the present invention is directed to the plasma processing apparatus according to the first aspect of the present invention wherein each jet hole is in a shape of a nozzle having an enlarged size (or diameter) toward the side of the processing chamber.

A seventh aspect of the present invention is directed to the plasma processing apparatus according to the first aspect of the present invention wherein the gas storage chamber is composed of a plurality of discrete gas storage chambers and a plurality of partition plates.

An eighth aspect of the present invention is directed to the plasma processing apparatus according to the first aspect of the present invention wherein the gas storage chamber is provided with plasma generating means.

A ninth aspect of the present invention is directed to the plasma processing apparatus according to the first aspect of the present invention wherein the gas storage chamber is provided with a radical source.

A tenth aspect of the present invention is directed to the plasma processing apparatus according to the first aspect of the present invention wherein the gas storage chamber is provided with an ion source.

An eleventh aspect of the present invention is directed to the plasma processing apparatus according to the tenth aspect of the present invention wherein the ion source is provided with ion accelerating means.

A twelfth aspect of the present invention is directed to the plasma processing apparatus according to the first aspect of the present invention wherein a diameter of the jet hole is smaller than a mean free path of neutral particles in the gas storage chamber.

A thirteenth aspect of the present invention is directed to the plasma processing apparatus according to the first aspect of the present invention wherein a longitudinal length of the jet hole is longer than a mean free path of the neutral particles in the gas storage chamber.

A fourteenth aspect of the present invention is directed to the plasma processing apparatus according to the first aspect of the present invention wherein a pressure within the processing chamber is lower than that of the gas storage chamber.

A fifteenth aspect of the present invention is directed to the plasma processing apparatus according to the first aspect of the present invention wherein a distance between the mounting stage and the partition plate is not longer than a mean free path of the neutral particles in the processing chamber.

A sixteenth aspect of the present invention is directed to the plasma processing apparatus according to the first aspect of the present invention wherein the supply system is provided with pulse valve supply means.

According to the first aspect of the present invention as described above, since the plasma processing apparatus comprises the processing chamber, the processing gas supply means for supplying the processing gases into the processing chamber, the plasma generating means for changing the processing gases supplied into the processing chamber to the plasma, the mounting stage for mounting an object to be processed which is provided in the processing chamber, bias applying means for applying the electrical bias to the mounting stage, the gas storage chamber which is placed at a position opposite to the face of the mounting stage for mounting the object being processed and which is provided with the supply system for supplying the neutral particles or the gases to generate the neutral particles, the partition plate which separates the gas storage chamber from the processing chamber and having the jet holes for jetting the neutral particles into the processing chamber, and the exhaust system, it is possible to perform, at a high processing rate, the surface processing of the workpiece having the patterns which includes a deep groove and/or hole which is very small in dimension and high in an aspect ratio.

According to the second aspect of the present invention wherein the partition plate is arranged to be the counter electrode to the mounting stage in the first aspect, the processing for the workpiece can be uniformly performed.

According to the third aspect of the present invention wherein the partition plate comprises the dielectric film formed on the electric conductive material in the second aspect, it is possible to obtain an effect that deterioration in the partition plate is prevented.

According to the fourth aspect of the present invention wherein the partition plate is grounded in the second aspect, a uniform processing of the workpiece can be carried out.

According to the fifth aspect of the present invention wherein the partition plate includes the power supply for applying the radio frequency or the DC bias voltage in the second aspect, the density of particular particles in the processing chamber can be adjusted by the selection of the material of the partition plate and/or the control of the electric potential of the partition plate. As a result, the processing conditions can be flexible.

According to the sixth aspect of the present invention, wherein each jet hole or port is formed in the shape of a nozzle having the enlarged diameter at the side of the processing chamber in the first aspect, the particles in the gas storage chamber can be jetted into the processing chamber without reducing a transport speed thereof during the passage through the jet hole.

According to the seventh aspect of the present invention wherein the gas storage chamber is constituted by a plurality of gas storage chambers and a plurality of partition plates in the first aspect, particle flows can be uniformly supplied to the workpiece and the processing for the workpiece can be uniformly carried out. Moreover, it is also possible to vary the processing of the workpiece in its face by changing the particles to be introduced.

According to the eighth aspect of-the present invention wherein the gas storage chamber includes the plasma generating means in the first aspect, the plasma can be generated at a lower pressure than in the conventional case, and the ions and/or neutral particles can be incident on the workpiece without collision or with a few collisions, and thus, anisotropy for processed profile can be enhanced. Moreover, a particular kind of the neutral radicals can be introduced into the processing chamber in a large number by adjusting the operating pressure and/or the source power of the plasma generating means which are provided in the gas storage chamber. As a result, the neutral radicals suitable for the intended processing can be supplied to the workpiece and the processing can be improved.

According to the ninth aspect of the present invention wherein the gas storage chamber includes the radical source in the first aspect, a large number of the neutral radicals suitable for the intended processing can be introduced into the processing chamber, so that the processing performance can be enhanced.

According to the tenth aspect of the present invention wherein the gas storage chamber includes the ion source in the first aspect, a large number of ions suitable for the intended processing can be supplied into the processing chamber, so that the processing performance can be enhanced.

According to the eleventh aspect of the present invention wherein the ion source is provided with the ion accelerating means in the tenth aspect, the neutral particles having an energy suitable for the intended processing can be supplied into the processing chamber in a large number, so that the processing performance can be enhanced.

According to the twelfth aspect of the present invention wherein the diameter of the jet hole is smaller than the mean free path of neutral particles in the gas storage chamber in the first aspect, a neutral particle flow which has a particular ratio of a temperature in a vertical direction to a temperature in a horizontal direction with respect to the workpiece face can be supplied to the workpiece.

According to the thirteenth aspect of the present invention wherein the length of the jet hole is greater than the mean free path of the neutral particles in the gas storage chamber in the first aspect, a neutral particle flow which has a particular ratio of a temperature in a vertical direction to a temperature in a horizontal direction with respect to the workpiece face can be supplied to the workpiece.

According to the fourteenth aspect of the present invention wherein the pressure of the processing chamber is lower than that of the gas storage chamber in the first aspect, when the neutral particles are to be jetted from the gas storage chamber to the processing chamber through the jet holes, a kinetic energy is given to the particles in the direction perpendicular to the workpiece face, so that the temperature in the direction perpendicular to the workpiece face can be raised. Thus, the temperature of the neutral particles in the direction perpendicular to the workpiece face becomes higher than the temperature in the horizontal direction, the neutral particles can easily be supplied to the bottom portion of the pattern having a high aspect ratio.

According to the fifteenth aspect of the present invention wherein the distance between the mounting stage and the partition plate is not longer than the mean free path of the neutral particles in the processing chamber in the first aspect, the neutral particles jetted from the gas storage chamber can be supplied to the surface of the workpiece without rescattering in the processing chamber.

According to the sixteenth aspect of the present invention wherein the supply system is provided with pulse valve supply means in the first aspect, the difference in the pressure between the gas storage chamber and the processing chamber greatly increases. Accordingly, the neutral particles or ions can be sufficiently supplied to the bottom portion of the pattern having a high aspect ratio.

DETAILED DESCRIPTION OF THE INVENTION

Preferred embodiments of the present invention will be described below with reference to FIGS. 1 to 9.

Embodiment 1

Figure 1:
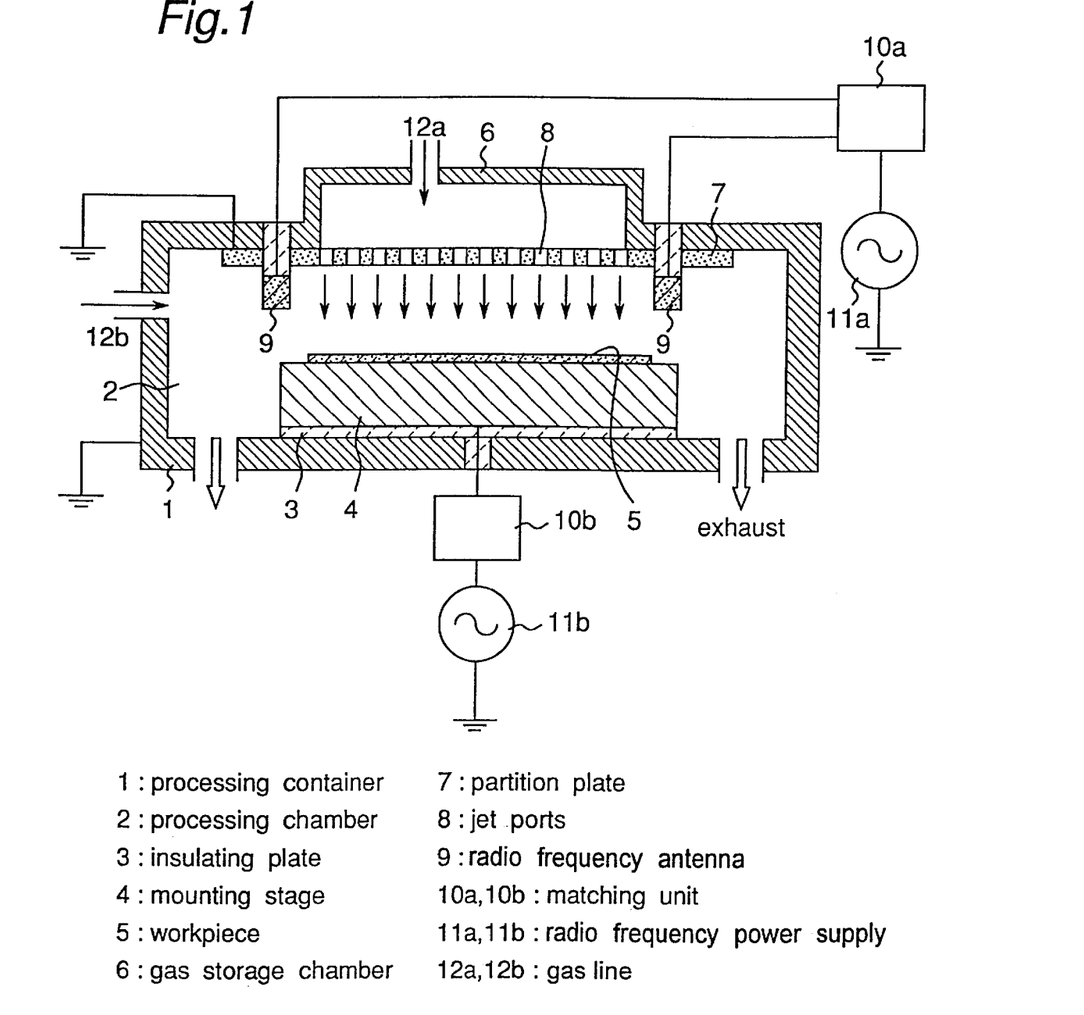
FIG. 1 is a schematic cross-sectional view of a plasma processing apparatus according to a first embodiment of the present invention.

FIG. 1 is a schematic cross-sectional view of the plasma processing apparatus according to the first embodiment of the present invention. The plasma etching processing apparatus shown in FIG. 1 has a processing container 1 formed of an electric conductor such as aluminum. A predetermined etching processing is carried out in a processing chamber 2 formed in the processing container 1. In addition, the wall of the processing container 1 is optionally protected by a coating, which is formed for example by an alumina or insert of a quartz plate between the processing container and plasma since the wall of the processing container 1 may be sputtered with a plasma generated in the processing chamber 2 depending on the kind of processing gases or the wall of the processing container 1 may be etched by a chemical reaction. Further, the inner wall of the processing chamber 2 may be heated to prevent reaction products or the like from depositing to the wall of the processing container.

The processing container 1 is grounded. The inside of the processing container 1 is provided with a mounting stage 4 for mounting a workpiece 5 thereon for example made of a semiconductor wafer (hereinafter, also referred to as a wafer) on an insulating plate 3 made of for example ceramic. A gas storage chamber 6 is provided in a position opposite to a face of the mounting stage 4 where the wafer 5 is mounted, and is airtightly connected to the processing container 1. The processing chamber 2 and the gas storage chamber 6 are partitioned by a partition plate 7. The gas storage chamber 6 is provided with a supply system for supplying one or more gases through a gas line 12a, and neutral particles (neutral radicals) which contribute to a reaction are generated in the gas storage chamber 6 by plasma generating means and radical generating means which are not shown in FIG. 1, for example, radio frequency discharge means or heating means. Alternatively, an arrangement may be selected wherein the neutral particles are generated in the other reaction vessels, passed through the line 12a and stored within the gas storage chamber 6.

The partition plate 7 is provided with a plurality of jet holes or ports 8 each of which is formed in a shape of a nozzle having an enlarged diameter at the side of the processing chamber. Through the jet holes 8, the neutral particles within the gas storage chamber 6 are jetted into the processing chamber 2 without reducing transport speed thereof.

Moreover, the partition plate 7 is a porous plate having a plurality of jet holes, which arrangement allows the particles to be supplied to the workpiece in a uniform flow, so that uniform processing of the workpiece is achieved.

Since the gas storage chamber is provided in the position opposite to the face of the workpiece, the neutral particles jetted from the jet holes in the direction toward the workpiece can reach the surface of the workpiece through the shortest distance. Therefore, the neutral particles having a directivity in the direction toward the workpiece (a direction perpendicular to the surface of the workpiece) are sufficiently supplied to the bottom portion of a pattern having a high aspect ratio and a processing rate can be enhanced.

In this embodiment, when the pressure in the gas storage chamber 6 is set higher than that of the processing chamber 2, the particles jetted from the gas storage chamber 6 have a more improved directivity toward the wafer 5 (a vertical component of the transport speed is relatively higher than a horizontal component thereof), so that the particles rarely collide with other particles in the processing chamber 2 and reach the surface of the wafer 5.

Besides, a difference in the pressure between the gas storage chamber 6 and the processing chamber 2 greatly increases by high speed exhaust means or pulse-driven gas supply means using a pulse valve for a gas supply system. When the difference in the pressure satisfies a supersonic free jet condition, the neutral particles introduced into the gas storage chamber 6 are jetted in a supersonic free jet through the jet holes 8. Consequently, the neutral particles can be fully supplied to the bottom portion of the pattern having a high aspect ratio.

Moreover, the particles can be prevented from collision in the processing chamber 2 by providing the mounting stage 4 at a distance which is almost equal to or shorter than the length of the mean free path of the jetted neutral particle flow. Thus, the particles can be fully supplied to the bottom portion of the pattern having a high aspect ratio.

By setting the diameter of the jet holes 8 smaller than the mean free path of the neutral particles in the gas storage chamber 6 or setting the length of the jet holes 8 longer than the mean free path of the neutral particles in the gas storage chamber 6, the neutral particles collide with the wall of the jet holes 8 twice or more times upon passing through the nozzle-shaped jet holes 8 and are transported to the processing chamber 2 to form a neutral particle flow having a particular uniform temperature in the vertical direction of the workpiece. As a result, a neutral particle flow which has a temperature in a vertical direction relatively higher than a temperature in a horizontal direction is supplied to the wafer 5. Therefore, the neutral particles can be fully supplied to the bottom portion of the pattern having a high aspect ratio.

In order to prevent the deposition of a film which causes the generation of dust, the wall of the gas storage chamber 6 and the partition plate 7 may be coated or heated by a heater. In the case where the gas storage chamber 6 and the partition plate 7 are heated by the heater, neutral particles can also be generated from the gases through heat dissociation by setting the temperature of the heater not less than the dissociating temperature of the gases.

The processing gases are supplied from a gas cylinder (not shown) into the processing chamber 2 through a gas line 12b. The plasma processing apparatus shown in FIG. 1 comprises, in the processing chamber 2, a radio frequency antenna 9 of a conductor, for example made of carbon in a spiral, a coil or a loop form and the antenna is often covered with dielectric materials, for example made of ceramic and/or quartz. A radio frequency power supply 11a is connected to the radio frequency antenna 9 through a matching unit 10a. When a radio frequency power is applied to the radio frequency antenna 9, electromagnetic waves are radiated from the radio frequency antenna so that a radio frequency electric field is formed in the processing chamber 2. The plasma processing apparatus is arranged to generate a plasma by causing electrons present in then electromagnetic field space collide with the processing gases supplied into the processing chamber 2, and ionizing the processing gases.

Consequently, ions are generated by plasma generating means provided in the processing chamber 2. As a result, a sufficient amount of ion flux can be supplied to the surface of the workpiece, thereby a high processing rate can be achieved.

While ions and neutral particles are generated by the plasma generating means provided within the processing chamber 2, the density of the neutral particles in the processing chamber can be controlled because the neutral particles are transported from the gas storage chamber 6 into the processing chamber 2 through the jet holes 8 in addition to the neutral particles generated in the processing chamber 2.

In FIG. 1, the plasma processing apparatus comprises the plasma generating means using the radio frequency antenna, however other plasma generating means may also be used.

In FIG. 1, although the gas line 12b is positioned on one side of the processing chamber 2, it may be constituted such that the gases are uniformly supplied with respect to the wafer 5.

In order to prevent metal contamination in an embodiment when the antenna is not covered with some suitable materials, for example ceramic or quartz, carbon, silicon or silicon carbide (SiC) may be used as the material of the radio frequency antenna 9 which is inserted in the processing chamber 2 through the partition plate 7.

Further, the mounting stage 4 is provided with wafer holding means and wafer cooling means which are not shown, and is connected to a radio frequency power supply 11b through the matching unit 10b. Therefore, ions in a plasma generated in the processing chamber 2 are accelerated by a radio frequency bias voltage which is independently applied to the mounting stage 4, for example, a radio frequency of 800 kHz, and such ions strike the wafer 5 mounted on the mounting stage 4. Thus, an etching process is carried out.

Moreover, the partition plate 7 is made of an electric conductor, for example, a silicon plate, and functions also as a counter electrode to the mounting stage 4 to which an electrical bias voltage is applied in the construction of the present invention. In the preset embodiment, the partition plate 7 is grounded. Consequently, the partition plate 7 is equivalent to an electrode which is provided in the position opposite to the mounting stage 4 and is grounded, so that the bias electric field to be applied to the mounting stage 4 can be uniformly applied to the workpiece. As a result, the workpiece can be uniformly processed. Moreover, the radio frequency electric field is applied between the mounting stage 4 and the partition plate 7. Therefore, the radio frequency electric field can be prevented from being applied to metal parts provided around the mounting stage. Thus, abnormal discharge such as arching can be effectively prevented.

The partition plate 7 may be constituted by forming a dielectric film on an electric conductor. Thus, a deterioration of the partition plate can be prevented.

Since the plasma processing apparatus according to the present embodiment has the above mentioned features, the neutral particles having a particular directivity to the face of the wafer 5 are incident on the face of the wafer 5. Usually, the neutral particles heated by the plasma or the like have a temperature on the order of about 500 K. According to the above mentioned feature, the neutral particles having the directivity to the face of the wafer 5 are jetted into the processing chamber 2. Then, the neutral particles rarely cause collision and reach the surface of the wafer 5, and get incident on the pattern on the surface of the wafer 5. The neutral particles incident in the pattern is affected by the side wall of a pattern, and may deposit on the side wall of the pattern or may be reflected. Since the kinetic energy of the neutral particles is about 0.05 eV, which is usually lower than that of incident ions, a time for interaction of the neutral particles with a pattern wall is longer than that of ions. Accordingly, the neutral particles diffuse while performing random reflection (diffusive reflection) on the pattern wall. In the embodiment according to the present invention, as described above, the temperature, in a vertical direction of the face of the wafer 5, of the neutral particles jetted from the jet holes 8 of the partition plate 7 is relatively higher than that in a horizontal direction thereof. Therefore, the position where the neutral particles first collide with the side wall tends to shift more deeply on the side wall as compared with the neutral particles which have equivalent temperatures in all direction. When a pattern having a high aspect ratio is processed, it may be considered that an amount of the flux reaching the bottom portion of the pattern (incident flux) increases. Such a mechanism will be described below with reference to FIG. 2.

Figure 2:
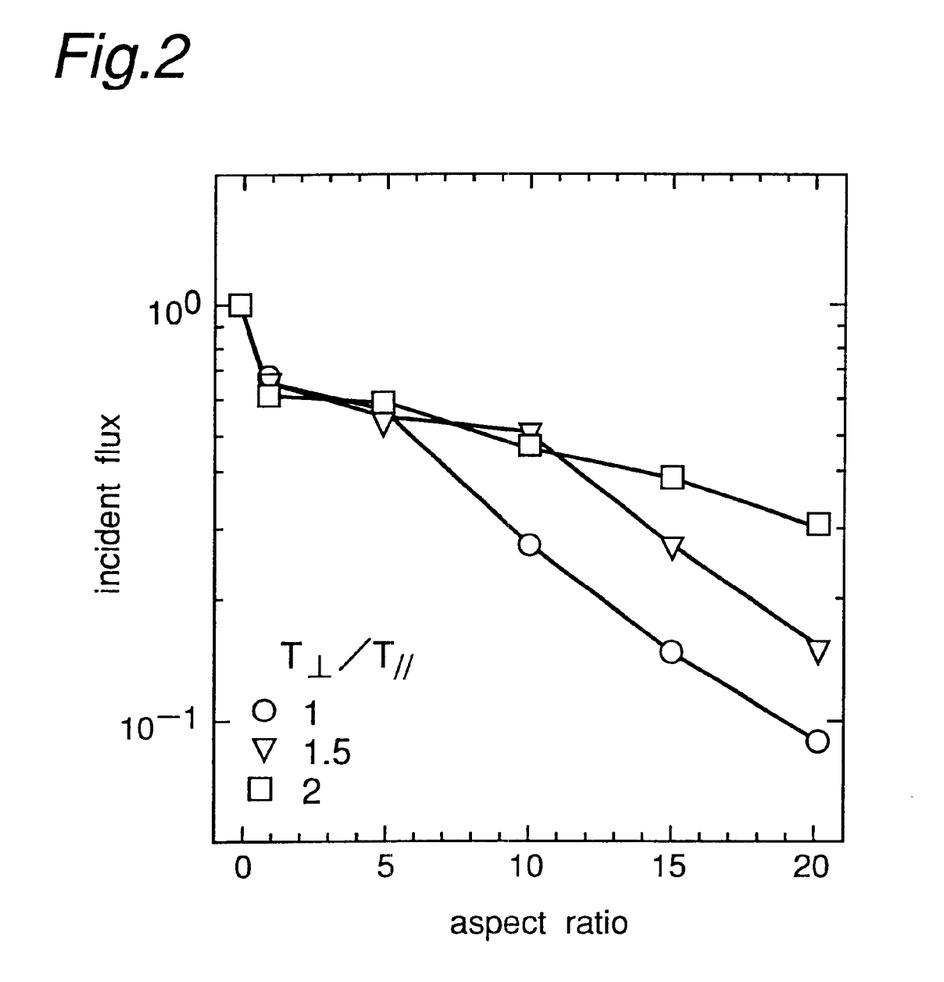
FIG. 2 is a graph showing an amount of flux of neutral particles into the bottom of a hole.

FIG. 2 shows a result of calculation of the amount of the incident flux of the neutral particles at the bottom of the hole when a relation of a temperature of the neutral particles entering the hole in a longitudinal direction (axial direction) of the hole (T $\perp$) and a temperature thereof in a direction perpendicular to the axis (vertical direction) of the hole (T $\parallel$) is varied wherein a trajectory calculation of the neutral particles is executed by using the Monte Carlo method. In FIG. 2, the axis of ordinates represents a normalized flux of the neutral particles and the axis of abscissa represents an aspect ratio of the hole. As shown in FIG. 2, as the aspect ratio increases, the amount of the flux of the neutral particles decreases. However, the amount of the flux of the neutral particles into the bottom of the hole can increase by raising a temperature, that is, a kinetic energy of the neutral particles in the axial direction of the hole. Consequently, a deterioration of the processing rate due to the lack of the neutral particles contributing to the etching reaction may be prevented.

Figure 3A:
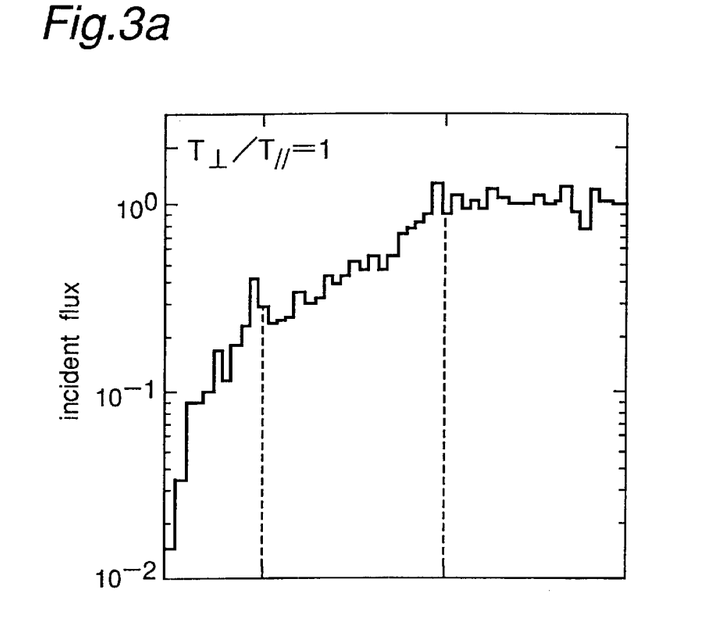
FIGS. 3a and 3b are charts showing an amount of the incident flux of the neutral particles into a hole having a high aspect ratio.
Figure 3B:
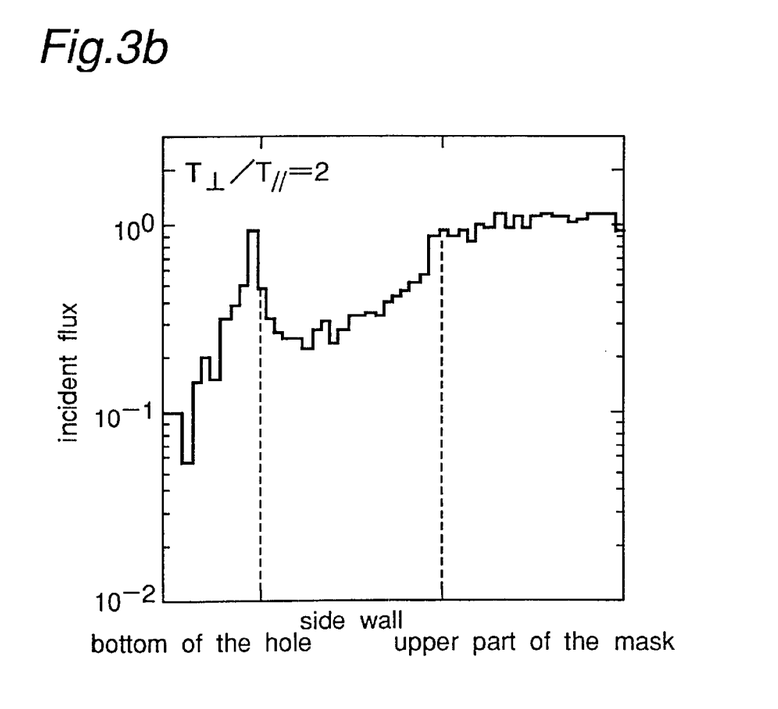

FIGS. 3a and 3b show the flux in a hole having a high aspect ratio. In FIGS. 3a and 3b, the result of calculation with an aspect ratio of 10 is shown. FIG. 3(a) shows the result of a conventional example and FIG. 3(b) shows the result of the present embodiment. It is shown from FIGS. 3(a) and 3(b) that the amount of the flux of the neutral particles is larger, not only at the bottom of the hole, but also at a deep position of the side wall, which is close to the bottom, and the particles have a relatively higher temperature in the axial direction of the hole according to the present embodiment is than the neutral particles having an equivalent temperature in all direction in the conventional case.

In a conventional apparatus in which the gas storage chamber 6 and the plasma generating means of the processing chamber 2 are integrally constituted, for example, the neutral particles which deposit onto a surface and have a function of preventing etching are supplied to the bottom of a pattern. However, in the apparatus according to the present embodiment in which the gas storage chamber 6 is separated from the processing chamber 2 having the plasma generating means, it is an advantage that only specific kind of neutral particles may be supplied to the bottom portion of the pattern in a large amount.

As in the conventional apparatus, when the diameter of the holes is reduced in order to increase a difference of pressure between a plasma chamber and a workpiece processing chamber, the plasma tends to be confined in the plasma chamber. Consequently, only a small amount of ions are transported to the processing chamber. On the other hand, the plasma generating means is provided within the processing chamber 2 in the present embodiment. Therefore, it is possible to generate a high plasma density in the processing chamber 2, thereby enhancing a processing rate. Moreover, it is also possible to generate a large area plasma by devising the shape and arrangement of the partition plate 7 and the radio frequency antenna 9. For example, the jet holes 8 are formed between every two turns of the radio frequency antenna 9.

Furthermore, since the partition plate 7 is grounded and is arranged at a position opposite to the wafer 5, the bias electric field can be uniformly applied to the wafer 5. As a result, the process can be uniformly carried out.

The constitution of the apparatus according to the present embodiment, as described above, allows a uniform processing of the wafer 5 having a pattern with a high aspect ratio at a high processing rate.

The present embodiment has been described mainly about the plasma etching processing apparatus, however, the same is also applicable to a plasma CVD processing apparatus. In particular, when a thin film is deposited on a pattern having a high aspect ratio, a larger amount of the neutral particles which act as precursors of the thin film can reach the bottom of the pattern having the high aspect ratio by such an apparatus according to the present invention. Further, since a bias electric field can be uniformly applied to the wafer 5, ions can be uniformly drawn into the wafer 5. Consequently, the pattern having the high aspect ratio can be covered with such a thin film through an ion assist deposition reaction, so that a uniform processing can be performed. In addition, since the radio frequency antenna 9 is arranged within the processing chamber 2 in the constitution shown in FIG. 1, it is effective for the deposition of an electrically conductive film as compared with the case where the radio frequency antenna 9 is arranged outside. Furthermore, when the radio frequency antenna 9 is made of a material containing a component of the deposited film, metal contamination can be prevented and plasma characteristics can also be prevented from being changed by the deposited film.

Embodiment 2

Figure 4:
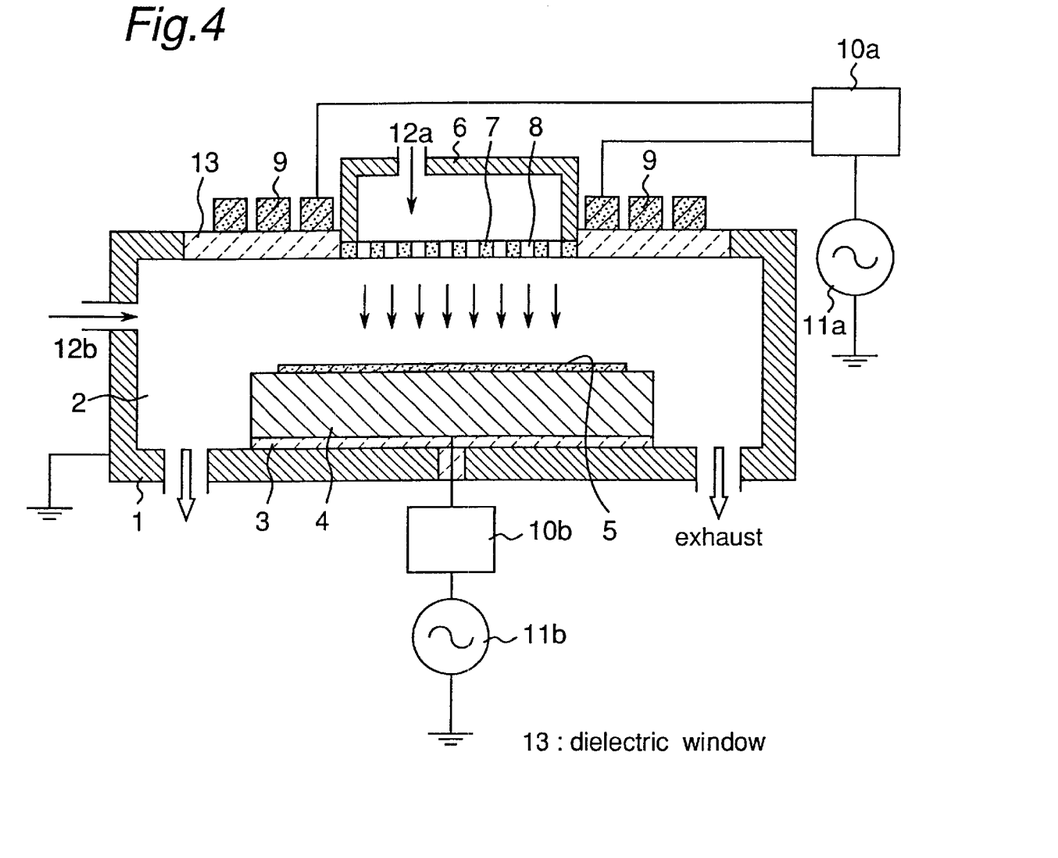
FIG. 4 is a schematic cross-sectional view of a plasma processing apparatus according to a second embodiment of the present invention.

FIG. 4 is a schematic cross-sectional view of a plasma processing apparatus according to the second embodiment of the present invention. The apparatus according to the second embodiment is similar to that of the first embodiment except that both the gas storage chamber 6 and the dielectric window 13 are provided in a position opposite to a face of the mounting stage 4 where the wafer 5 is mounted and are airtightly connected to the processing container 1, and that the radio frequency antenna 9 is arranged outside the dielectric window 13, by which arrangement a plasma may be generated by applying a radio frequency power to the radio frequency antenna 9 and injecting a radio frequency electric field into the processing chamber 2 through the dielectric window 13.

According to the second embodiment of the present invention, since the radio frequency antenna 9 is arranged outside the plasma processing apparatus, the radio frequency antenna 9 is not sputtered by the plasma and thus the generation of dust can be prevented.

Embodiment 3

Figure 5:
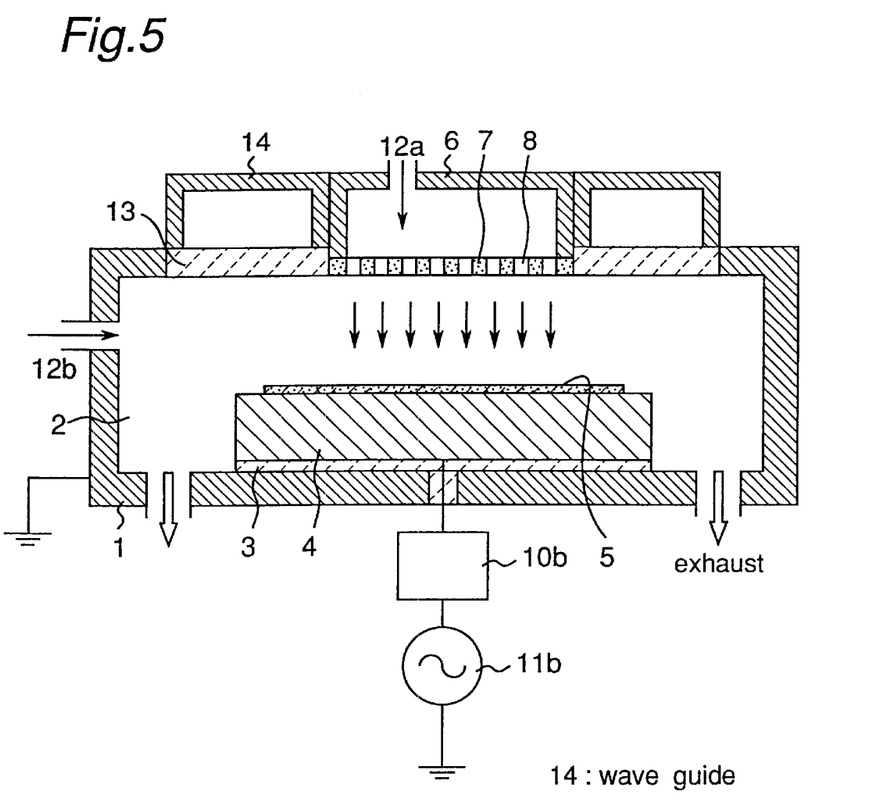
FIG. 5 is a schematic cross-sectional view of a plasma processing apparatus according to a third embodiment of the present invention.

FIG. 5 is a schematic cross-sectional view of a plasma processing apparatus according to the third embodiment of the present invention. In the apparatus according to the third embodiment, both the gas storage chamber 6 and the dielectric window 13 are provided in a position opposite to a face of the mounting stage 4 where the wafer 5 is mounted and are airtightly connected to the processing container 1, and the gas storage chamber 6 and the processing chamber 2 are partitioned by the partition plate 7. A wave guide 14 in a ring form is provided outside the dielectric window 13 for introducing microwaves. The microwaves transmitted through the wave guide 14 are injected into the processing chamber 2 through the dielectric window 13, thereby generating a plasma.

According to the third embodiment of the present invention, the microwaves are also transmitted as surface waves to the central portion of the processing chamber 2 through the portion between the partition plate 7 and the plasma sheath. Therefore, a large area plasma can be generated and processing can be uniformly carried out.

Embodiment 4

Figure 6:
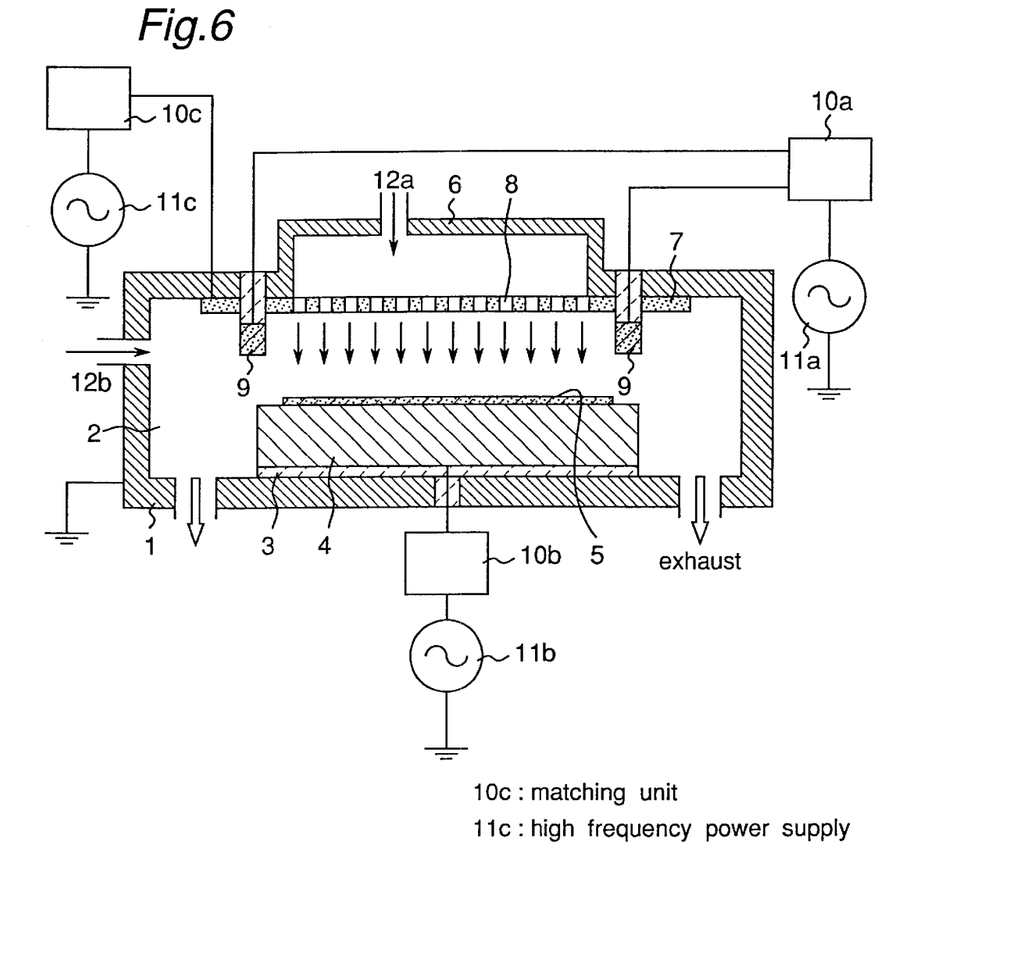
FIG. 6 is a schematic cross-sectional view of a plasma processing apparatus according to a fourth embodiment of the present invention.

FIG. 6 is a schematic cross-sectional view of a plasma processing apparatus according to the fourth embodiment of the present invention. The apparatus according to the present embodiment is the same as that of the first embodiment except that a radio frequency power supply 11c is connected to the partition plate 7 through a matching unit 10c.

In the apparatus having the above mentioned constitution, for example, when a fluorocarbon-based gas is introduced as the processing gas, fluorine radicals are present in a processing chamber 2, which are generated by plasma generating means. However, there may be a case wherein the density of the fluorine radicals is too high depending on the processing conditions, so that an anisotropic etched profile may not be obtained. In such a case, use of silicon as the material of the partition plate 7 makes it possible that the generation of the fluorine radicals is decreased to some extent by causing a reaction between the silicon of the partition plate 7 and the fluorine radicals.

Moreover, application of the electrical bias voltage to the partition plate 7 makes it possible to draw not only the fluorine radicals but also ions into the partition plate 7, thereby decreasing the density of ions in the processing chamber 2. Furthermore, when the partition plate 7 is made of carbon, carbon can be supplied into the processing chamber 2 by utilizing the sputtering of the partition plate 7. As described above, the density of specific particles in the processing chamber 2 can be adjusted by the selection of the material of the partition plate 7 and/or the control of the electric potential of the partition plate 7. As a result, the processing conditions can be flexible.

The power supply for applying power to the partition plate 7 may be a DC power supply.

Embodiment 5

Figure 7:
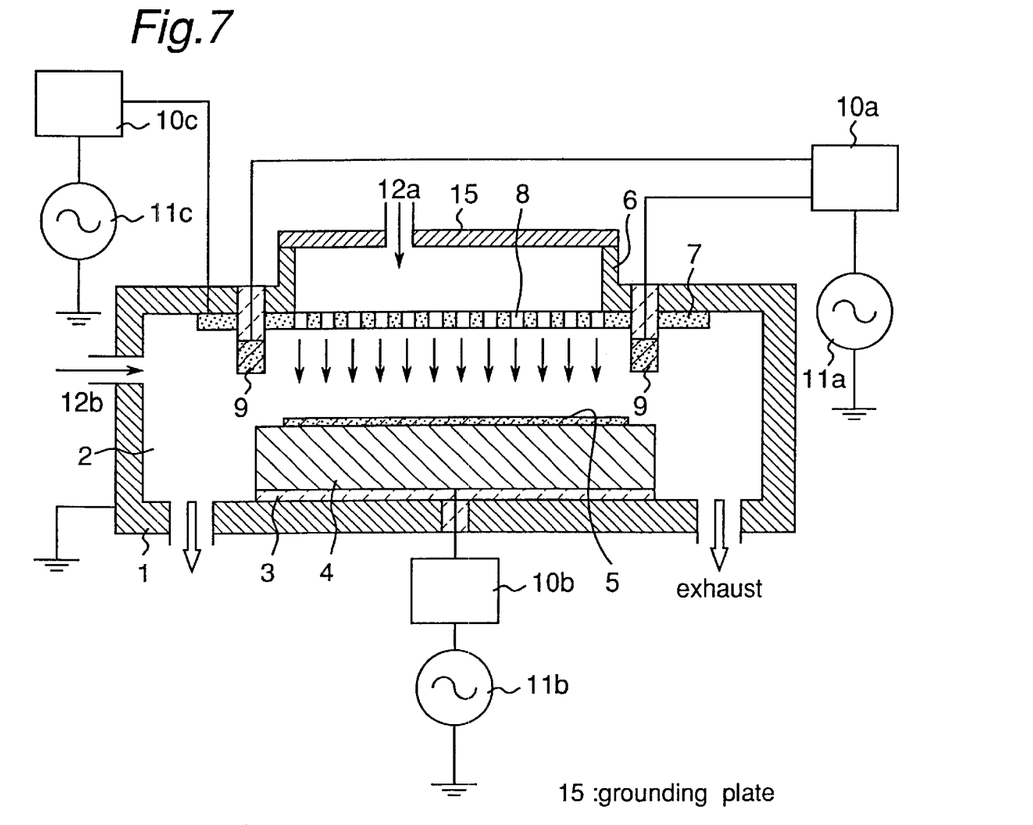
FIG. 7 is a schematic cross-sectional view of a plasma processing apparatus according to a fifth embodiment of the present invention.

FIG. 7 is a schematic cross-sectional view of a plasma processing apparatus according to the fifth embodiment of the present invention. In the same manner as in the fourth embodiment, the apparatus according to the fifth embodiment has such a constitution that a radio frequency power supply 11c is connected to a partition plate 7 through a matching unit 10c. The constitution of the fifth embodiment is the same as that of the fourth embodiment except that a grounding plate 15 is arranged at a position opposite to the partition plate 7 in the gas storage chamber 2.

In the fifth embodiment, application of a radio frequency to the partition plate 7 makes it possible to change the gases introduced into the gas storage chamber 6 through the gas line 12a into a plasma. Consequently, the plasma of the gases which is introduced into the gas storage chamber 6 can be generated and the dissociated species of the gases can be generated. Then, the ions and electrons are jetted into the processing chamber 2 through the jet holes 8. By using them as seeds for discharge, a plasma can be generated in the processing chamber 2 at a lower pressure as compared with the conventional case. As a result, the ions and neutral particles can strike the wafer 5 accompanying few collisions, so that the anisotropy for processed profile can be enhanced. Furthermore, the dissociated species generated in the gas storage chamber 6 are also jetted into the processing chamber 2 through the jet holes 8. Accordingly, a large number of a particular kind of neutral radicals can be introduced into the processing chamber 2 by adjusting the operating pressure and/or electric power of the plasma generating means provided in the gas storage chamber 6. As a result, the neutral radicals suitable for the intended processing can be supplied to the workpiece and the processing can be improved.

In the same manner as in the above mentioned fourth embodiment, the density of specific particles in the processing chamber 2 can be adjusted by the selection of the material of the partition plate 7 and/or the regulation of the electric potential of the partition plate 7. As a result, the processing conditions can be flexible.

It is preferable that the frequency of the radio frequency power to be applied to the partition plate 7 is selected to have a phase difference or a frequency difference from the other frequency in order to avoid cohesion of the radio frequency waves.

Embodiment 6

Figure 8:
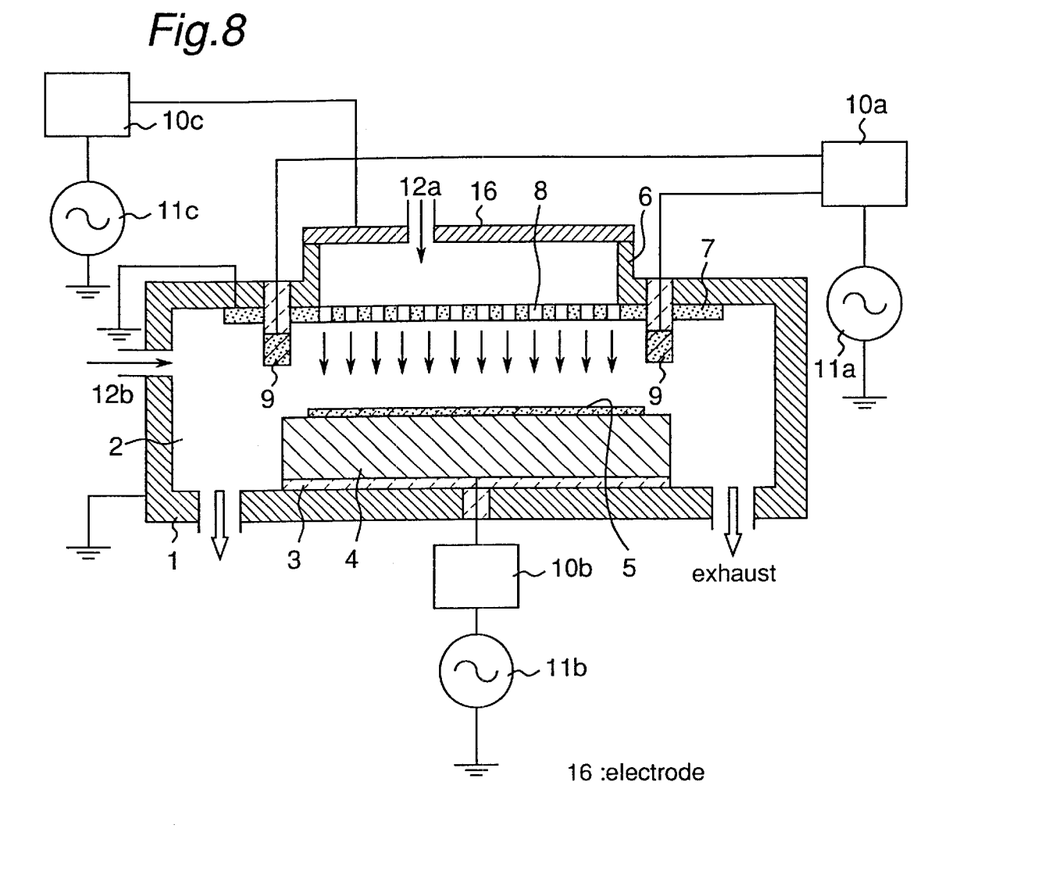
FIG. 8 is a schematic cross-sectional view of a plasma processing apparatus according to a sixth embodiment of the present invention.

FIG. 8 is a schematic cross-sectional view of a plasma processing apparatus according to the sixth embodiment of the present invention. The apparatus according to the present embodiment has such a constitution that the partition plate 7 is grounded as in the first embodiment. The constitution of this embodiment is the same as that of the first embodiment except that an electrode 16 is arranged at a position opposite to the partition plate 7 in the gas storage chamber 6.

According to the above mentioned constitution, the gases introduced into the gas storage chamber 6 through a gas line 12a can be changed into a plasma by applying a radio frequency bias voltage to the electrode 16. In the same manner as in the fifth embodiment, consequently, the plasma of the gases introduced into the gas storage chamber 6 can be generated and the dissociated species of the gases can be generated. Then, the ions and electrons are jetted into the processing chamber 2 through jet holes 8. By using them as seeds for discharge, a plasma can be generated in the processing chamber 2 at a lower pressure than in the conventional apparatus. As a result, the ions and neutral particles can strike the wafer 5 accompanying few collisions, so that the anisotropy for processed profile can be enhanced. Furthermore, the dissociated species generated in the gas storage chamber 6 are also jetted into the processing chamber 2 through the jet holes 8.

Accordingly, by regulating the operating pressure and/or electric power of the plasma generating means provided in the gas storage chamber 6, a large number of a certain kind of neutral radicals can be introduced into the processing chamber 2. As a result, the neutral radicals suitable for the processing can be supplied to the workpiece. Thus, the processing can be enhanced.

Moreover, since the partition plate 7 is grounded, it is possible to prevent the radio frequency waves applied to the electrode 16 from being propagated into the processing chamber 2.

In the present embodiment, a radio frequency discharge is employed as a the plasma generating mean which is provided in the gas storage chamber 6, other discharging means may be used.

It is preferable that the frequency of the radio frequency power to be applied to the partition plate 7 is selected to have a phase difference or a frequency difference from the other radio frequency wave in order to avoid cohesion of the radio frequency waves.

Embodiment 7

Figure 9:
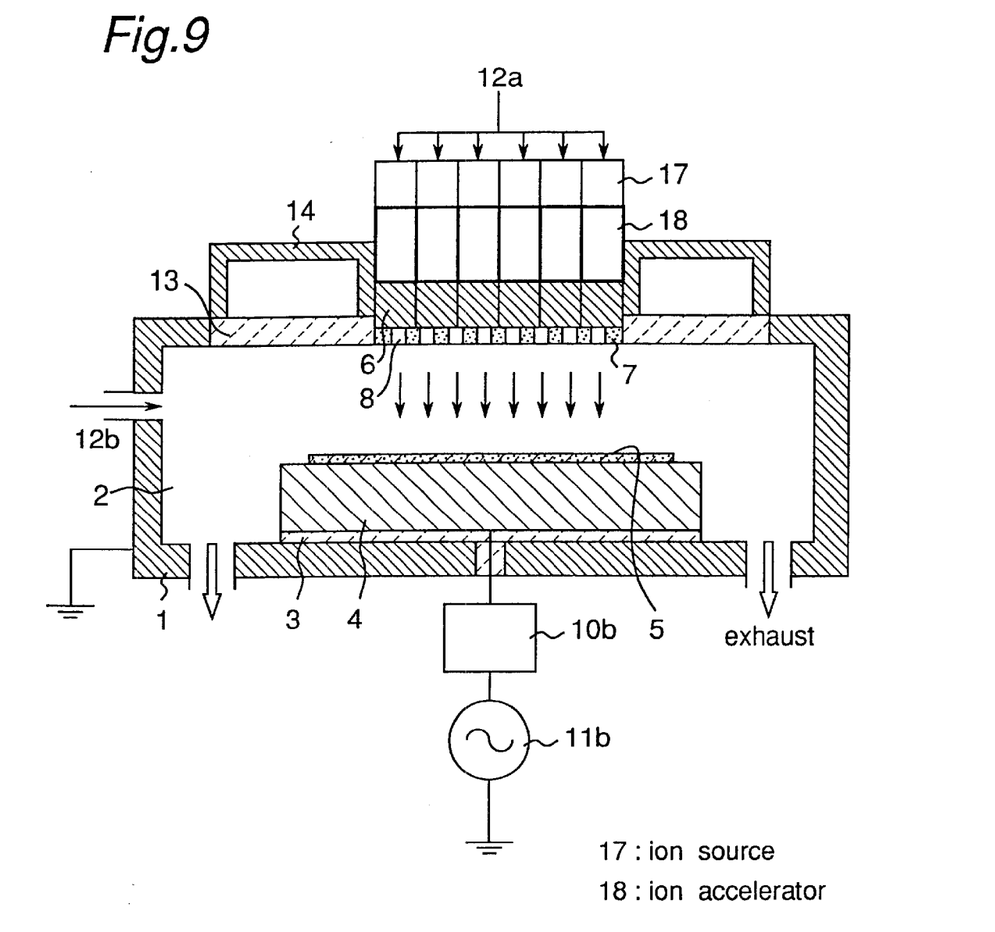
FIG. 9 is a schematic cross-sectional view of a plasma processing apparatus according to a seventh embodiment of the present invention.

FIG. 9 is a schematic cross-sectional view of a plasma processing apparatus according to the seventh embodiment of the present invention. The constitution of this embodiment is the same as that of the third embodiment except that a plurality of gas storage chambers 6 and a plurality of partition plates 7 are used and are arranged at a position opposite to the face of the workpiece in the apparatus, and that each gas storage chamber 6 includes an ion source 17 and an ion accelerator 18. Since a plurality of the gas storage chambers 6 and a plurality of the partition plates 7 are arranged at a position opposite to the face of the workpiece, particle flows can be uniformly supplied to the workpiece and the workpiece can be uniformly processed. Moreover, the processing for the workpiece can also be varied in the face by changing particles to be introduced into each gas storage chamber 6.

Furthermore, the ions generated by the ion source 17 which is provided within the gas storage chamber 6 are accelerated by the ion accelerator 18 and reach the gas storage chamber 6. The gases and the ions which are introduced into the gas storage chamber 6 collide with each other so that the ions are changed into neutral particles by charge transfer and are transported to the processing chamber 2 through the jet holes 8 to reach the wafer 5.

According to the above mentioned constitution, the ions having a desired energy can be changed into the neutral particles by charge exchange. Therefore, high-speed neutral particles can be supplied to the wafer 5. For example, the neutral particles heated by a plasma have a temperature of about 500 degrees K which is equivalent to about 0.05 eV. On the other hand, the accelerated ions lose some energy by the collision in the gas storage chamber 6. However, accelerating the ions to about 100 eV by the ion accelerator, the neutral particles having energy of about several tens of electron volts (eV) can be supplied to the wafer 5. Moreover, although the moving direction of the ions is not always perpendicular to the face of the wafer 5 due to the collision of the ions with the gases in the gas storage chamber 6, the neutral particles collimated to some extent can be supplied to the face of the wafer 5 by adjusting the size, length and shape of the jet holes 8. As a result, processing of the pattern having the high aspect ratio can be achieved.

Although the seventh embodiment is illustrated about an apparatus having a plurality of the gas storage chambers 6, the apparatus may have only one gas storage chambers 6. In addition, the constitution having a plurality of the gas storage chambers 6 which are arranged at a position opposite to the face of the workpiece as in the seventh embodiment may be applied to any of the constitution selected from the first to sixth embodiments.

Although the gas storage chambers 6 is provided with the plasma generating means in the fifth and sixth embodiments, and the gas storage chambers 6 is provided with the ion source 17 and the ion accelerator 18 in the seventh embodiment, the gas storage chamber 6 may be provided with a radical source. Such a constitution makes it possible to introduce a particular kind of a neutral radical, which is suitable for the intended processing, in a large amount into the processing chamber 2. As a result, the neutral radical suitable for the processing can be supplied to the workpiece so that processing performance can be enhanced.

Moreover, the gas storage chamber 6 can be provided with an ion source. Consequently, a large number of ions suitable for the processing can be supplied to the processing chamber 2. Thus, the processing performance can be enhanced.

The materials and shapes described in the above mentioned first to seventh embodiments are presented only for explanation, and they may be changed, are not restricted thereto and can be properly changed if necessary.

It should be understood by those skilled in the art that the materials and shapes described in the above mentioned first to seventh embodiments are not limited to the specific details and representative embodiments but presented for explanation only, and various modifications thereof are contemplated as necessary within the scope of the invention.

What is claimed is:

1. A plasma processing method including:
   introducing at least one first gas into a processing chamber including a mounting stage supporting a substrate having a surface;
   generating a plasma in the first processing gas;
   introducing a second processing gas into a gas storage chamber separated from the processing chamber by a partition opposite the mounting stage and including a plurality of jet holes;
   jetting neutral particles of the second processing gas from the gas storage chamber toward the substrate through the jet holes in a direction generally perpendicular to the surface of the substrate, thereby plasma processing the substrate; and
   limiting the gas pressure in the processing chamber so that neutral particles jetted from the gas storage chamber have a mean free path in the processing chamber not shorter than a separation between the partition plate and the surface of the substrate.

2. The method according to claim 1 wherein generating a plasma of the processing gas comprises applying a radio frequency electric field between the mounting stage and the partition.

3. The method according to claim 1 wherein generating a plasma of the processing gas includes applying a bias voltage to the mounting stage and grounding the partition.

4. A plasma processing method including:
   introducing at least one first gas into a processing chamber including a mounting stage supporting a substrate having a surface;
   generating a plasma in the first processing gas;
   introducing a second processing gas into a gas storage chamber separated from the processing chamber by a partition opposite the mounting stage, the partition having a thickness and including a plurality of jet holes having lengths extending through the thickness of the partition;
   jetting neutral particles of the second processing gas from the gas storage chamber toward the substrate through the jet holes in a direction generally perpendicular to the surface of the substrate, thereby plasma processing the substrate; and
   controlling the gas pressures in the processing chamber and the gas storage chamber so the mean free path of the neutral particles is shorter than the lengths of the jet holes in the partition.

5. The method according to claim 4 wherein generating a plasma of the first processing gas comprises applying a radio frequency electric field between the mounting stage and the partition.

6. The method according to claim 4 wherein generating a plasma of the first processing gas includes applying a bias voltage to the mounting stage and grounding the partition.

7. A plasma processing method including:
   introducing at least one first gas into a processing chamber including a mounting stage supporting a substrate having a surface;
   generating a plasma in the first processing gas;
   introducing a second processing gas into a gas storage chamber separated from the processing chamber by a partition opposite the mounting stage and including a plurality of jet holes;
   jetting neutral particles of the second processing gas from the gas storage chamber toward the substrate through the jet holes in a direction generally perpendicular to the surface of the substrate, thereby plasma processing the substrate; and
   controlling the gas pressures in the processing chamber and the gas storage chamber so the mean free path of the neutral particles is longer than the diameter of the jet holes in the partition.

8. The method according to claim 7 wherein generating a plasma of the first processing gas comprises applying a radio frequency electric field between the mounting stage and the partition.

9. The method according to claim 7 wherein generating a plasma of the first processing gas includes applying a bias voltage to the mounting stage and grounding the partition.

* * * * *